(12) United States Patent
Lee et al.

(10) Patent No.: US 7,893,610 B2
(45) Date of Patent: Feb. 22, 2011

(54) TANDEM ORGANIC ELECTROLUMINESCENT DEVICE

(75) Inventors: Hsin-Hung Lee, Hsinchu (TW); Chung-Chun Lee, Yunlin County (TW)

(73) Assignee: Au Optronics Corp., Hsinchu (TW)

( * ) Notice: Subject to any disclaimer, the term of this patent is extended or adjusted under 35 U.S.C. 154(b) by 190 days.

(21) Appl. No.: 12/417,748

(22) Filed: Apr. 3, 2009

(65) Prior Publication Data

US 2009/0189523 A1 Jul. 30, 2009

Related U.S. Application Data

(62) Division of application No. 11/550,826, filed on Oct. 19, 2006, now Pat. No. 7,535,165.

(30) Foreign Application Priority Data

Apr. 28, 2006 (TW) ............................. 95115258 A

(51) Int. Cl.
*H01L 51/50* (2006.01)
*H01L 51/52* (2006.01)

(52) U.S. Cl. ..................... 313/504; 313/503; 313/512; 313/506

(58) Field of Classification Search ......... 313/500–512; 257/72, 88, 89, 93, E51.019–E51.022; 315/169.3
See application file for complete search history.

(56) References Cited

U.S. PATENT DOCUMENTS

| | | | |
|---|---|---|---|
| 6,099,746 A | 8/2000 | Kim | |
| 6,215,244 B1 * | 4/2001 | Kuribayashi et al. | ......... 313/505 |
| 6,693,296 B1 * | 2/2004 | Tyan | ............................. 257/40 |
| 6,717,259 B2 | 4/2004 | Kimura | |
| 6,717,356 B1 | 4/2004 | Kim | |
| 6,872,472 B2 | 3/2005 | Liao et al. | |
| 7,760,165 B2 * | 7/2010 | Cok | ............................. 345/76 |
| 2003/0189401 A1 | 10/2003 | Kido et al. | |
| 2005/0140275 A1 | 6/2005 | Park | |
| 2005/0140287 A1 | 6/2005 | Ko | |
| 2005/0285509 A1 | 12/2005 | Funamoto et al. | |

(Continued)

FOREIGN PATENT DOCUMENTS

CN 1211829 3/1999

(Continued)

OTHER PUBLICATIONS

CN Office Action mailed Nov. 30, 2007.

*Primary Examiner*—Mariceli Santiago
(74) *Attorney, Agent, or Firm*—Thomas, Kayden, Horstemeyer & Risley

(57) ABSTRACT

A tandem organic electroluminescent device. The tandem organic electroluminescent device comprises a substrate having a pixel thin film transistor. A rib with chambered corners is formed on the substrate, surrounding a display region. A protrusion is formed in the display region. A plurality of organic light emitting diodes is stacked vertically in the display region, covering the protrusion, wherein each organic light emitting diode comprises a top electrode, an organic electroluminescent layer, and a bottom electrode. The bottom electrode of the bottommost organic light emitting diode is electrically connected to the pixel thin film transistor. A common electrode electrically connected to the top electrode of the topmost organic light emitting diode directly over the protrusion.

8 Claims, 4 Drawing Sheets

U.S. PATENT DOCUMENTS

| | | |
|---|---|---|
| 2006/0055313 A1 | 3/2006 | Bae et al. |
| 2006/0119260 A1 | 6/2006 | Kim |
| 2008/0079352 A1* | 4/2008 | Cok .......................... 313/504 |

FOREIGN PATENT DOCUMENTS

| | | | |
|---|---|---|---|
| CN | 1484323 | | 3/2004 |
| CN | 1665362 | | 9/2005 |
| EP | 0917410 | | 5/1999 |
| EP | 1388894 | | 2/2004 |
| JP | 11161228 | A * | 6/1999 |
| JP | 2005005223 | A * | 1/2005 |
| JP | 2005285401 | A * | 10/2005 |

* cited by examiner

TANDEM ORGANIC ELECTROLUMINESCENT DEVICE

CROSS-REFERENCE TO RELATED APPLICATION

This application is a division of U.S. patent application Ser. No. 11/550,826, filed Oct. 19, 2006 and entitled "Tandem Organic Electroluminescent Device".

BACKGROUND OF THE INVENTION

1. Field of the Invention

The invention relates to an organic electroluminescent device, and more particularly to a tandem organic electroluminescent device.

2. Description of the Related Art

Recently, with the development and wide application of electronic products, such as mobile phones, PDA, and notebook computers, there has been increasing demand for flat display elements which consume less electric power and occupy less space. Among flat panel displays, organic electroluminescent devices are self-emitting, and highly luminous, with wider viewing angle, faster response, and a simple fabrication process, making them the industry display of choice.

An organic light-emitting diode (OLED) is a light-emitting diode that uses an organic layer as the active layer. In recent years, OLEDs have been gradually employed in flat panel displays. The trend in organic electroluminescent display technology is for higher luminescent efficiency and longer lifetime.

Recently, in order to enhance the brightness of the single pixel and attach full color display, a so-called "tandem type organic electroluminescent device" has been provided. The tandem type organic electroluminescent device comprises a plurality of organic light-emitting diodes which are vertically stacked and cascaded together.

FIG. 1 is a cross section of a conventional tandem type organic electroluminescent device 10. The conventional tandem type organic electroluminescent device 10 comprises a first organic light-emitting diode 20, and a second organic light-emitting diode vertically stacked above the first organic light-emitting diode 20.

Specifically, the first organic light-emitting diode 20 comprises a first bottom electrode 21, a first organic electroluminescent layer 22, and a first top electrode 23, and the second organic light-emitting diode 30 comprises a second bottom electrode 31, a second organic electroluminescent layer 32, and a second top electrode 33. Particularly, in the conventional tandem type organic electroluminescent device 10, the first top electrode 23 is electrically connected and directly contacts the second bottom electrode 31.

Since the resistance of electrode (conductive layer) is lower than that of organic electroluminescent layer, carriers are apt to migrate within the electrodes rather than passing through the boundary energy barriers of the interfaces between electrodes and organic electroluminescent layers, resulting in crosstalk 40 between adjacent pixels, as shown in FIG. 2.

In order to solve the aforementioned problems, a conventional tandem type organic electroluminescent device with very thinner intermediate electrode has been provided, wherein the thinner intermediate electrode provides a sheet resistance about ten to dozens of thousands ohms. However, the electrode is thin enough that reproductively thereof is poor. Another conventional tandem type organic electroluminescent device with patterned intermediate electrode has also been provided to prevent the pixels from crosstalk. The electrode patterning process employing shadow mask is not suitable for use in large display fabrication.

Another tandem type organic electroluminescent device e with layer connecting each OLED device is provided. To enhance efficiency, the connection layer has both electron and hole transport abilities and high optical transmittance.

The connection layer can be a doping organic layer such as N-type doping organic layer, P-type doping organic layer or combinations thereof. However, the performance of tandem type organic electroluminescent device depends on the stability of the connection layer. Since the tandem type organic electroluminescent device utilizes high operating voltage, the carrier transport ability of the connection layer is weakened due to carrier diffusion effect.

US Patent NO. 20030189401 discloses a tandem type organic electroluminescent device 100 having a charge generating layer (CGL) as a connection layer, as shown in FIG. 3.

The tandem type organic electroluminescent device 100 comprises a substrate 110, a bottom electrode 120, a first organic electroluminescent layer 130, a charge generating layer 140, a second organic electroluminescent layer 150, and a top electrode 160. Specifically, the charge generating layer 140 serves as a floating electrode rather than being electrically connected to other electrodes. The tandem type organic electroluminescent device 100 exhibits improved current efficiency and lifetime.

Suitable material of the charge generating layer, however, is currently unavailable and usually toxic (such as $V_2O_5$). Therefore, it is difficult to achieve mass production. Moreover, the charge generating layer comprising $V_2O_5$ has high resistance, resulting in a high driving voltage of the tandem type organic electroluminescent device.

Therefore, it is necessary to develop a tandem organic electroluminescent device to solve the aforementioned problems.

BRIEF SUMMARY OF THE INVENTION

Accordingly, an object of the invention is to provide a novel tandem organic electroluminescent device, solving the aforementioned problems, without increased process complexity.

An exemplary embodiment of such a tandem organic electroluminescent device comprises a substrate having a pixel thin film transistor. A rib with chambered corners is formed on the substrate, surrounding a display region. A protrusion is formed in the display region. A plurality of organic light emitting diodes is stacked vertically in the display region, covering the protrusion, wherein each organic light emitting diode comprises a top electrode, an organic electroluminescent layer, and a bottom electrode. The bottom electrode of the bottommost organic light emitting diode is electrically connected to the pixel thin film transistor. A common electrode is electrically connected to the top electrode of the topmost organic light emitting diode directly over the protrusion.

Particularly, the protrusion has a height not less than that of the rib with chambered corners, and the rib with chambered corners has a height not less than that of the stacked vertically organic light emitting diodes.

According to another exemplary embodiment of the invention, a tandem organic electroluminescent device comprises a substrate having a pixel thin film transistor. A rib with chambered corners is formed on the substrate, surrounding a display region. A plurality of organic light emitting diodes is stacked vertically in the display region, wherein each organic light emitting diode comprises a top electrode, an organic electroluminescent layer, and a bottom electrode. The bottom electrode of the bottommost organic light emitting diode is electrically connected to the pixel thin film transistor. A common electrode is formed over the rib, wherein the top electrodes of two adjacent topmost organic light emitting diodes are electrically connected by the common electrode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
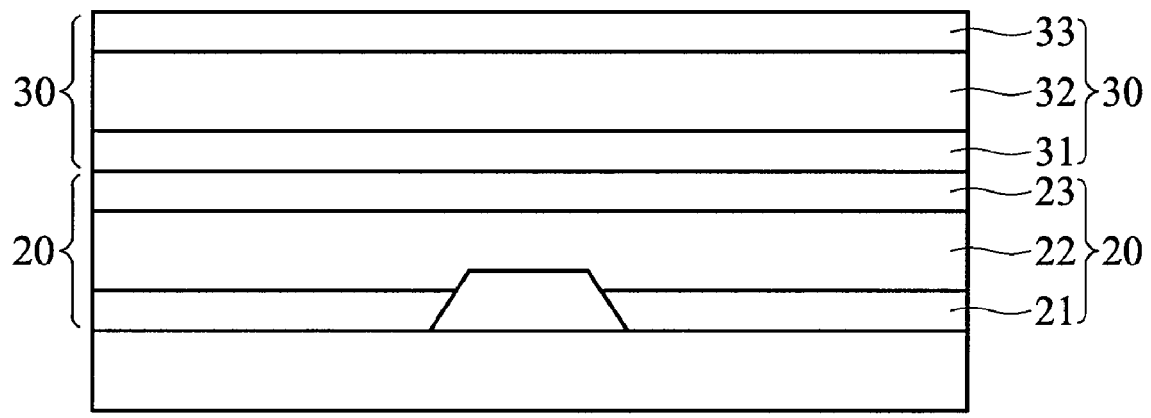
FIG. 1 shows a cross section of a conventional tandem type organic electroluminescent device.
Figure 2:
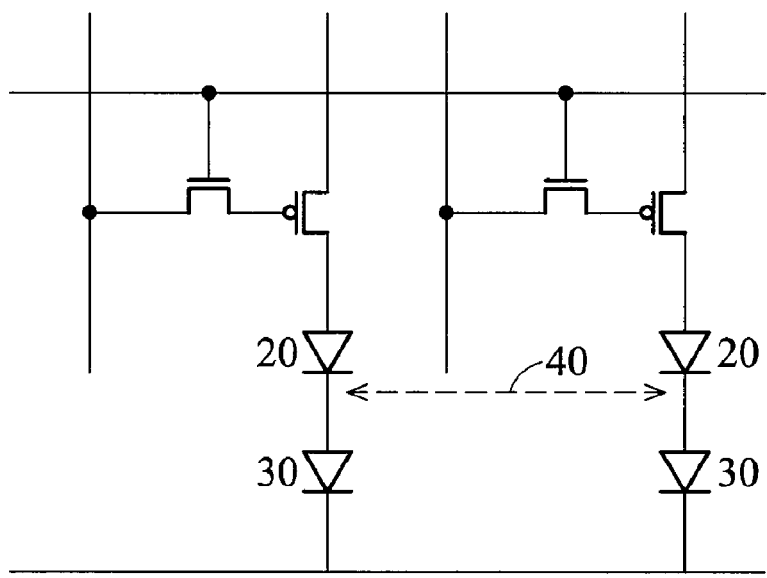
FIG. 2 is a circuit diagram of the conventional tandem organic electroluminescent device.
Figure 3:
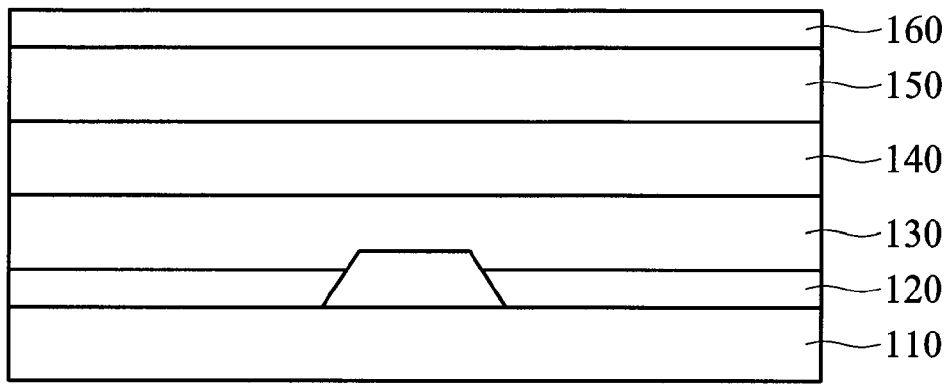
FIG. 3 is a cross section of a conventional tandem type organic electroluminescent device with charge generating layer.
Figure 4:
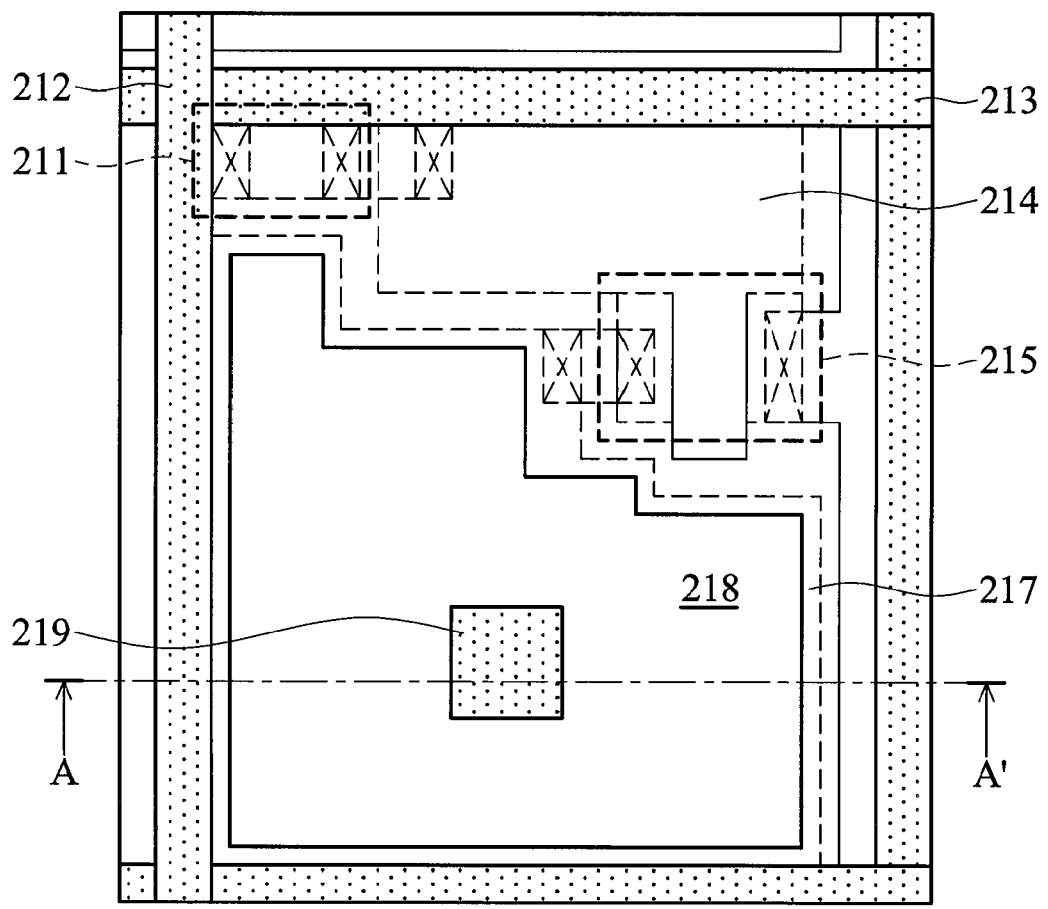
FIG. 4 is a partial schematic diagram of a tandem organic electroluminescent device according to an embodiment of the invention.

FIG. 4 is a partial schematic diagram of a tandem organic electroluminescent device according to an embodiment of the invention. The tandem organic electroluminescent device comprises a plurality of pixel areas 200 arranged in a matrix.

Each pixel area 200 comprises a thin film transistor 211 electrically connected to a data line 212 extending along a Y axis, a scan line 213 extending along an X axis, a capacitor 214, a pixel thin film transistor 215, and a rib 217 with chambered corners. The rib 217 with chambered corners is formed on the substrate, surrounding a display region 218. Particularly, the pixel area 200 further comprises a protrusion 219 formed within the display region 218. Further, the pixel area 200 further comprising a plurality of organic light emitting diodes stacked vertically in the display region 218, covering the protrusion 219. Each organic light emitting diode comprises a bottom electrode, an organic electroluminescent layer, and a top electrode (from bottom to top). Particularly, the bottom electrode of the bottommost organic light emitting diode is electrically connected to the pixel thin film transistor 215. Further, the top electrode of the topmost organic light emitting diode is electrically connected to a common electrode (not shown).

Figure 5:
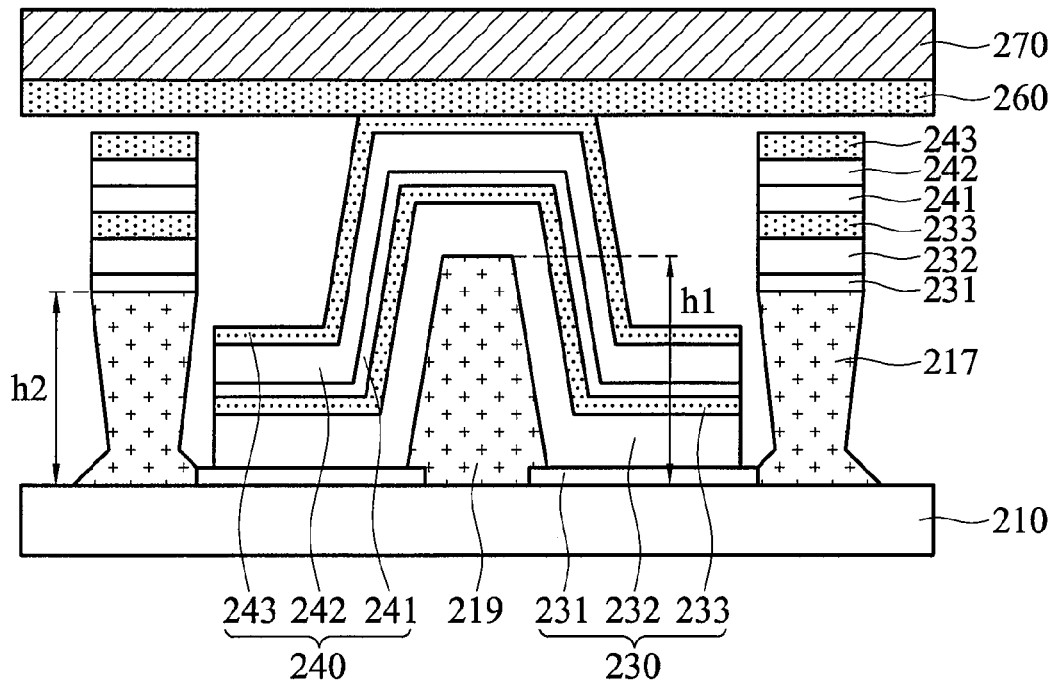
FIG. 5 is a cross section of FIG. 4 along line A-A'.

FIG. 5 is cross section of FIG. 4 along line A-A'. Herein, the plurality of organic light emitting diodes can comprise two organic light emitting diodes stacked vertically. In some embodiments of the invention, the plurality of organic light emitting diodes can comprises at least two organic light emitting diodes) stacked vertically, such as three or four organic light emitting diodes stacked vertically.

Referring to FIG. 5, the tandem organic electroluminescent device comprises a first organic light emitting diode 230 and a second organic light emitting diode 240. The first and second organic light emitting diodes 230 and 240 are formed on the substrate 210 after forming the rib 217. The rib has a height of 10 nm and 10,000 nm and can be transparent materials such as polyimide, patterned by photolithography.

The method for forming the first and second organic light emitting diode 230 and 240 and the protrusion 219 comprises a first electrode 231 formed on the substrate 220 and electrically connected to the pixel thin film transistor. After patterning of the first electrode 231, the protrusion 219 is formed on the substrate 210 within the display region 218, wherein the protrusion 219 has a height h1 not less than the height h2 of the rib 217 with chambered corners. The height h1 of protrusion 219 is preferably between 10 nm and 10,000 nm. It should be noted that the protrusion has tapered sidewalls, resulting in subsequent layer conformally disposed thereon. Next, a first organic electroluminescent layer 232 and a first top electrode 233 are sequentially formed on the first electrode 231, wherein the first bottom electrode 231, the first organic electroluminescent layer 232, and the first top electrode 233 comprise the first organic light emitting diode 230. The second bottom electrode 241, the second organic electroluminescent layer 242, and the second top electrode 243 are sequentially formed on the first top electrode 233, wherein the second bottom electrode 241, the second organic electroluminescent layer 242, and the second top electrode 243 comprise the second organic light emitting diode 240. The first and second organic electroluminescent layers 232 and 242 comprise polymer electroluminescent material or small molecule electroluminescent material.

Figure 8:
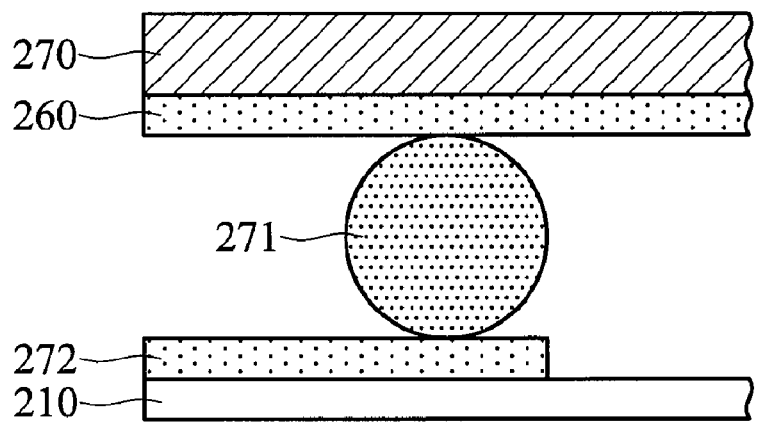
FIG. 8 is a cross section of a sealing structure according to a tandem organic electroluminescent device.

After the organic light emitting diodes 230 and 240 are stacked vertically, a sealing case 270 having a common electrode 260 formed beforehand is bonded to the substrate 210, resulting in the second top electrode 243 electrically connecting to the common electrode 260. As shown in FIG. 8, the sealing case 270 is mounted on the substrate by means of an electrically conductive adhesive 271, wherein the common electrode 260 is electrically connected to a contract pad 272 via electrically conductive adhesive 271.

Figure 6:
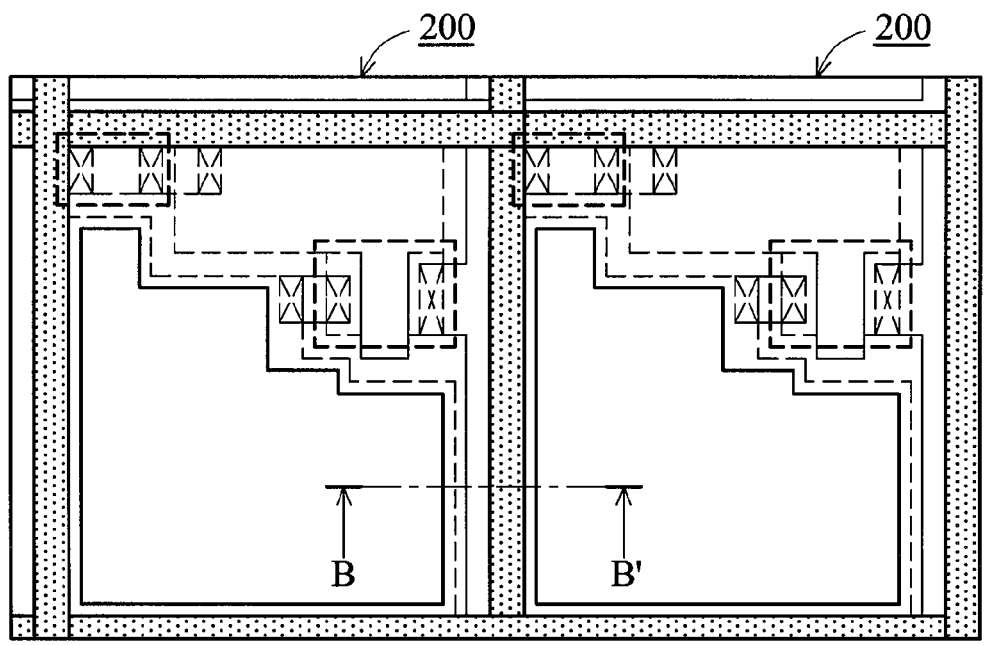
FIG. 6 is a partial schematic diagram of a tandem organic electroluminescent device according to another embodiment of the invention.
Figure 7:
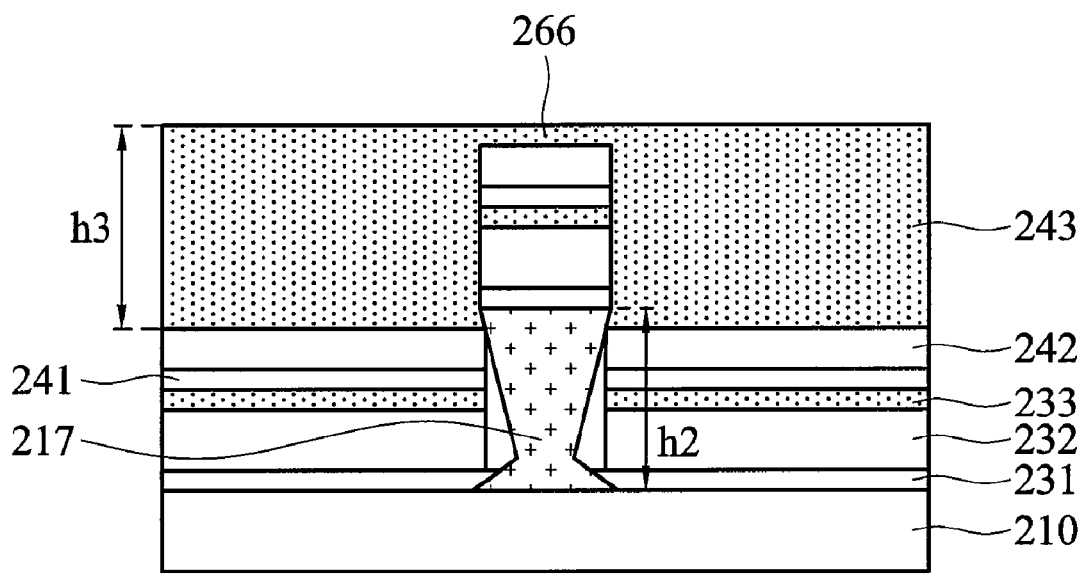
FIG. 7 is a cross section of FIG. 6 along line B-B'.

FIG. 6 is a partial schematic diagram of a tandem organic electroluminescent device according to another embodiment of the invention. The tandem organic electroluminescent device comprises a plurality of pixel areas 200 arranged in a matrix. As shown in FIG. 7 illustrating a cross section of FIG. 6 along line B-B'. Herein, the rib 217 is separated form the first top electrode 233 and the second bottom electrode 241 within the adjacent pixel areas 200, thereby preventing crosstalk. Moreover, in this embodiment, a thicker metal layer serves as the second top electrode 243, and the adjacent pixels areas are electrically connected via the second top electrode 243, thereby coupled to Vss. Therefore, it is not necessary to additionally form a common electrode. As a main feature and a key aspect, the height h3 of the second top electrode 243 directly over the pixel area 218 is larger than the height h2 of the rib 217, referring to FIG. 7. The conductive layer 266 and the second top electrode 243 can be of the same material and deposited by the same process. The method for forming the conductive layer 266 comprises forming a metal layer and then planarizing for the metal layer.

According to the invention, tandem organic electroluminescent devices with novel structures are provided to solve the aforementioned problems posed in convention tandem type organic electroluminescent device with charge generating layer (CGL). Since the rib has chambered corners (as shown in FIG. 7), the first top electrode 233 and the second bottom electrode 241 within the adjacent pixel areas 200 are separated, preventing the adjacent pixels areas 200 from crosstalk.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A tandem organic electroluminescent device, comprising:
   a substrate having a pixel thin film transistor;
   a rib with chambered corners formed on the substrate, surrounding a display region;
   a plurality of organic light emitting diodes stacked vertically in the display region, wherein each organic light emitting diode comprises a top electrode, an organic electroluminescent layer, and a bottom electrode, and the bottom electrode of the bottommost organic light emitting diode is electrically connected to the pixel thin film transistor; and
   a common electrode formed over the rib, wherein the top electrodes of two adjacent topmost organic light emitting diode are electrically connected by the common electrode.

2. The device as claimed in claim 1, wherein the height of the vertically stacked organic light emitting diodes exceeds than that of the rib.

3. The device as claimed in claim 1, wherein the organic electroluminescent layer comprises polymer electroluminescent material.

4. The device as claimed in claim 1, wherein the organic electroluminescent layer comprises small molecule electroluminescent material.

5. The device as claimed in claim 1, wherein the organic electroluminescent layer consists of a single organic material layer.

6. The device as claimed in claim 1, wherein the organic electroluminescent layer consists of a plurality of organic material layers.

7. The device as claimed in claim 1, wherein the rib has a height of 10 nm~10,000 nm.

8. The device as claimed in claim 1, wherein the plurality of organic light emitting diodes comprises at least two organic light emitting diodes stacked vertically.

* * * * *